United States Patent [19]

Kogan

[11] Patent Number: 4,805,152
[45] Date of Patent: Feb. 14, 1989

[54] REFRESH CELL FOR A RANDOM ACCESS MEMORY

[75] Inventor: Grigory Kogan, Portland, Oreg.

[73] Assignee: National Semiconductor Corporation, Santa Clara, Calif.

[21] Appl. No.: 92,419

[22] Filed: Sep. 3, 1987

[51] Int. Cl.[4] .................... G11C 7/00; H03K 17/687
[52] U.S. Cl. .................... 365/222; 365/203; 307/578
[58] Field of Search ............ 365/222, 203, 226, 189; 307/482, 264, 526–528

[56] References Cited

U.S. PATENT DOCUMENTS

| | | | |
|---|---|---|---|
| 3,449,683 | 6/1969 | Gane | 307/578 |
| 4,610,003 | 9/1986 | Natori | 365/222 |
| 4,689,495 | 8/1987 | Liu | 307/578 |
| 4,691,304 | 9/1987 | Hori et al. | 365/226 |

FOREIGN PATENT DOCUMENTS

| | | | |
|---|---|---|---|
| 53-79365 | 7/1978 | Japan | 307/482 |
| 55-105892 | 8/1980 | Japan | 365/226 |
| 56-168433 | 12/1981 | Japan | 307/578 |
| 58-142416 | 8/1983 | Japan | 365/226 |

Primary Examiner—Stuart N. Hecker
Assistant Examiner—Alfonso Garcia
Attorney, Agent, or Firm—Limbach, Limbach & Sutton

[57] ABSTRACT

A refresh cell of the type utilized for recharging or "refreshing" data stored in a storage element of a random access memory includes a first field effect transistor (FET) having its drain connected to a supply voltage, its source connected to the drain of a second FET and its gate connected to a first side of a capacitor. The second FET has its drain connected to the source of the first FET, its source connected to a column line of a random access memory and its gate connected to receive a row line signal from the random access memory. The capacitor has its first side connected both to the gate of the first FET and to a first side of a diffused resistive element. The second side of the capacitor is connected to receive a pump signal. The second end of the nonlinear resistor is connected to the source-drain interconnection of the two FETs.

4 Claims, 1 Drawing Sheet

REFRESH CELL FOR A RANDOM ACCESS MEMORY

BACKGROUND OF THE INVENTION

1. Field of the Invention

The present invention relates to integrated circuits and, in particular, to a high density, parallel refresh cell for a dynamic random access memory. A memory array utilizing parallel refresh cells in accordance with the present invention can be refreshed in a single access or refresh cycle.

2. Discussion of the Prior Art

If no read or write cycles are performed on a cell of a dynamic memory within a period of time, then the stored voltage levels of the cell begin to decay and must be "refreshed".

FIG. 1 shows a 4-transistor parallel refresh cell for a random access memory (RAM). As shown in FIG. 1, field effect transistors (FETs) 10 and 12 are connected sequentially between a supply voltage $V_{CC}$ and a column line of a RAM. An MOS capacitor 14 is connected between a pump input and the gate of transistor 10. A third field effect transistor 16 has control a signal PC applied to its source while its drain is connected to the gate of transistor 10. The gate of transistor 12 is connected to receive a row (or word) line signal of the RAM.

During refresh, signal PC stays at the $V_{CC}$ level and the pump signal toggles between $V_{SS}$ and $V_{CC}$. During a read cycle, the signal PC and the PUMP signal remain at $V_{CC}$ and the row line signal goes high. During a write cycle, signal PC and the pump signal go to ground while the row line signal goes high.

Assume that a "1" has been written to node S in FIG. 1. As stated above, if no read or write cycles have been performed during an approximately 4 msec period, then the voltage levels at nodes G and S will decay due to leakage. Therefore, a "refresh" must be performed.

On receiving a refresh signal, control signal PC stays at $V_{CC}$ level and PUMP will go to ground. If node S is at a voltage $\geq 2V_T$, then at least $1V_T$ will pass from PC to node G through transistor 16. Therefore, MOS capacitor 14 will be on. Where $V_T$ is the treshold voltage, then PUMP goes to $V_{CC}$, boosting node G to a voltage lead of at least $V_{CC}+1V_T$. This opens transistor 10 and restores the voltage level of node S to $V_{CC}$.

In the Read Mode, PUMP temporarily goes low during propagation of a new address through the row and column decoders. The PC signal stays high. If node S is at a voltage greater than or equal to $2V_T$, then node G will be at least at the $1V_T$ level. Then PUMP goes to $V_{DD}$ and capacitively pulses node G to at least $V_{DD}+V_T$ level, connecting node S to the $V_{CC}$ power supply through transistor 10. This sustains a "1" at node S.

In the case where node S is at the OV level, transistor 16 is closed and no charge penetrates to node G from PC. Capacitor 14 is also off and has no effect on node G. Therefore, the "0" at node S remains unchanged. Since the PUMP and PC signals are connected to each individual cell within the memory, all cells are refreshed in parallel during the Read Cycle.

The conventional refresh cell configuration described above in conjunction with FIG. 1 suffers from two major disadvantages. First, it requires a relatively large number of devices for the function provided. Second, it requires a complicated control scheme.

SUMMARY OF THE INVENTION

The present invention provides a dense refresh cell which requires relatively simple control. A preferred embodiment of a parallel refresh cell in accordance with the present invention comprises a first field effect transistor (FET) having its drain connected to a supply voltage, its source connected to the drain of a second FET and its gate connected to one side of a capacitor; a second FET having its drain connected to the source of the first FET, its source connected to a column line of a random access memory and its gate connected to receive a row line signal from the random access memory; a capacitor having a first side connected to both the gate of the first FET and to one side of a nonlinear resistor and a second side connected to receive a pump signal; and a nonlinear resistor having one end connected to the first side of the capacitor and a second end connected to the drain-source interconnection between the first FET an the second FET.

DETAILED DESCRIPTION OF THE INVENTION

Figure 2:
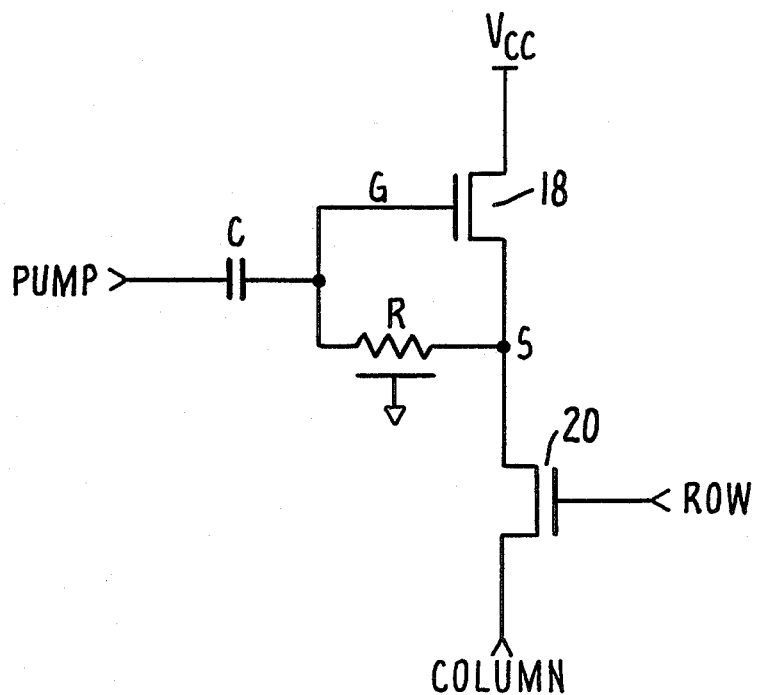
FIG. 2 is a schematic diagram illustrating an embodiment of a parallel refresh cell in accordance with the present invention.

FIG. 2 shows a two transistor, parallel refresh cell in accordance with the present invention.

The parallel refresh cell shown in FIG. 2 consists of sequentially connected field effect transistors (FETs) 18 and 20 which are connected between a supply voltage $V_{CC}$ and a column line of a random access memory. A PUMP signal is connected to one side of a capacitor C. The other side of capacitor C is connected both to the gate of FET transistor 18 as well as to the drain/source interconnection between transistor 18 and transistor 20 via nonlinear resistor R. The gate of transistor 20 is connected to receive a row line signal.

Linear capacitor C can be built vertically by using a double polysilicon structure. Thus, capacitor C does not require extra cell area as do MOS capacitors of the type utilized in the refresh cell shown in FIG. 1.

Nonlinear resistor R is a N- diffusion. Concentration of impurities is low enough so that the N- region can be completely depleted at approximately 3V bias.

During the write cycle for the parallel refresh cell shown in FIG. 2, the PUMP signal stays low, the row line signal goes high, and the column line is either high or low. If the column line is low, then the gate of transistor 18 will be discharged to ground through resistor R. If the column line signal is high, then the gate of transistor 18 will be precharged to the voltage corresponding to the complete depletion of the N- diffusion, i.e., approximately 3V.

During the refresh mode, the row line signal goes low and the PUMP signal toggles between ground and $V_{CC}$. If "0" was written into the cell, then resistor R is on, the gate of transistor 18 is connected to storage node S, and hence, memory cell remains at 0V. If a "1" was written, then resistor R is off and the gate of transistor 18 will be bootstrapped by the PUMP signal above $V_{CC}$. This refreshes the "1".

During the read cycle, the PUMP signal stays high and the columns are precharged to the voltage of complete depletion of the N-diffusion, i.e. approximately 3V. Then the selected row goes high, opening transistor 20. If "0" was written into the cell, then transistor 18 is off and there is no change on the column. If "1" was written into the cell, then transistor 18 is on and the column line will go to $V_{CC}$.

Figure 1:
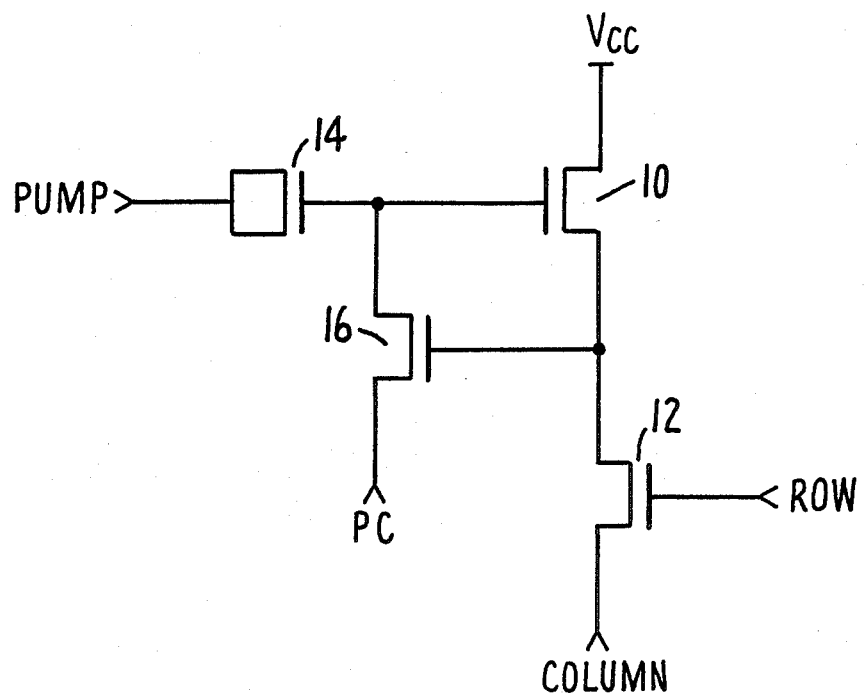
FIG. 1 is a schematic diagram illustrating a conventional refresh cell for a random access memory.

Therefore, a parallel refresh cell in accordance with the present invention contains only one-half the transistors and one less control line than the conventional parallel refresh cell shown in FIG. 1. This corresponds to high density and much simpler circuitry.

It should be understood that various alternatives to the embodiment of the invention described herein may be employed in practicing the invention. It is intended that the following claims define the scope of the invention and that structure within the scope of these claims and their equivalents be covered thereby.

What is claimed is:

1. Apparatus for maintaining the voltage level stored at a preselected storage location of a random access memory, the apparatus comprising
   (a) a first field effect transistor (FET) having its drain connected to a supply voltage, its source connected to the drain of a second FET and its gate connected to one side of a capacitor;
   (b) a second FET having its drain connected to the source of the first FET, its source connected to a column line of the random access memory and its gate connected to receive a row line signal of the random access memory;
   (c) a capacitor having a first side connected to both the gate of the first FET and to one side of a diffused resistive element and a second side connected to receive a pump signal; and
   (d) a diffused resistive element having one end connected to the first side of the capacitor and its second end connected to the drain-source interconnection between the first FET and the second FET.

2. Apparatus as in claim 1 wherein the diffused resistive element comprises an N-diffusion.

3. Apparatus as in claim 1 wherein the diffused resistive element comprises an N-diffusion that can be completely depleted at approximately 3V bias.

4. Apparatus as in claim 1 wherein the first and second sides of the capacitor comprise polysilicon.

* * * * *